(12) United States Patent
Dodson et al.

(10) Patent No.: US 10,304,560 B2
(45) Date of Patent: May 28, 2019

(54) PERFORMING ERROR CORRECTION IN COMPUTER MEMORY

(71) Applicant: International Business Machines Corporation, Armonk, NY (US)

(72) Inventors: John S. Dodson, Austin, TX (US); Marc A. Gollub, Round Rock, TX (US); Warren E. Maule, Cedar Park, TX (US); Brad W. Michael, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 15/255,368

(22) Filed: Sep. 2, 2016

(65) Prior Publication Data
US 2018/0067798 A1   Mar. 8, 2018

(51) Int. Cl.
*G11C 29/00* (2006.01)
*G06F 11/10* (2006.01)
*G06F 12/1009* (2016.01)
*G06F 12/0871* (2016.01)
*G06F 3/06* (2006.01)

(52) U.S. Cl.
CPC .......... *G11C 29/70* (2013.01); *G06F 11/1048* (2013.01); *G06F 11/1064* (2013.01); *G06F 12/0871* (2013.01); *G06F 12/1009* (2013.01); *G06F 3/064* (2013.01); *G06F 3/0619* (2013.01); *G06F 3/0673* (2013.01)

(58) Field of Classification Search
CPC . G11C 29/70; G06F 12/0871; G06F 11/1064; G06F 12/1009
See application file for complete search history.

(56) References Cited

U.S. PATENT DOCUMENTS

| | | | | |
|---|---|---|---|---|
| 4,209,809 A | * | 6/1980 | Chang ................ | G11B 5/59655 360/53 |
| 4,506,362 A | * | 3/1985 | Morley ................ | G06F 11/106 714/6.1 |
| 4,577,240 A | * | 3/1986 | Hedberg .............. | G11B 5/5521 360/22 |
| 4,939,694 A | * | 7/1990 | Eaton .................. | G11C 29/42 365/200 |

(Continued)

OTHER PUBLICATIONS

Appendix P; List of IBM Patent or Applications Treated as Related, Dec. 2, 2016, 2 pages.

*Primary Examiner* — Joseph D Torres
(74) *Attorney, Agent, or Firm* — Nathan M. Rau

(57) ABSTRACT

Performing error correction in computer memory including receiving a read request targeting a read address within the computer memory; accessing a mark table comprising a plurality of entries, each entry including a field specifying a region size, a field specifying a match address, and a field specifying a mark location; performing a lookup of the mark table using the read address including, for each entry in the mark table: generating a mask based on the region size stored in the entry; determining, based on the mask, whether the read address is within a memory region specified by the match address and region size stored in the entry; and if the read address is within the memory region specified by the match address and region size stored in the entry, performing error correction using the mark location stored in the entry.

14 Claims, 6 Drawing Sheets

(56) References Cited

U.S. PATENT DOCUMENTS

| | | | |
|---|---|---|---|
| 4,964,129 A * | 10/1990 | Bowden, III | G06F 11/073 714/704 |
| 4,964,130 A * | 10/1990 | Bowden, III | G06F 11/073 714/704 |
| 5,014,273 A | 5/1991 | Gagliardo et al. | |
| 5,390,309 A * | 2/1995 | Onodera | G06F 12/1036 711/203 |
| 5,644,539 A * | 7/1997 | Yamagami | G06F 3/0601 365/185.33 |
| 5,872,905 A * | 2/1999 | Ono | G06F 3/0601 711/100 |
| 8,352,806 B2 | 1/2013 | Gollub et al. | |
| 8,484,529 B2 | 7/2013 | Alves et al. | |
| 8,650,437 B2 | 2/2014 | Fry et al. | |
| 8,689,080 B2 | 4/2014 | Carman et al. | |
| 8,862,953 B2 | 10/2014 | Gollub et al. | |
| 9,092,361 B2 | 7/2015 | Honda et al. | |
| 9,244,852 B2 | 1/2016 | Prasad | |
| 2002/0191319 A1 | 12/2002 | Liew et al. | |
| 2003/0088805 A1 * | 5/2003 | Majni | G06F 11/108 714/5.1 |
| 2004/0078700 A1 | 4/2004 | Jeong | |
| 2006/0007801 A1 * | 1/2006 | Takashima | G11B 7/00458 369/44.27 |
| 2008/0072118 A1 * | 3/2008 | Brown | G11C 29/56 714/763 |
| 2009/0164727 A1 * | 6/2009 | Penton | G06F 11/1064 711/118 |
| 2009/0300425 A1 | 12/2009 | Gollub et al. | |
| 2009/0313526 A1 | 12/2009 | Neuman | |
| 2010/0037044 A1 | 2/2010 | Yang et al. | |
| 2010/0287445 A1 | 11/2010 | Dell et al. | |
| 2010/0293437 A1 | 11/2010 | Gollub et al. | |
| 2011/0320911 A1 | 12/2011 | Fry et al. | |
| 2011/0320914 A1 | 12/2011 | Alves et al. | |
| 2012/0173936 A1 | 7/2012 | Johnson et al. | |
| 2013/0007542 A1 | 1/2013 | Carman et al. | |
| 2013/0326293 A1 | 12/2013 | Muralimanohar et al. | |
| 2014/0026011 A1 | 1/2014 | Huang et al. | |
| 2014/0195867 A1 | 7/2014 | Gollub et al. | |
| 2014/0223239 A1 | 8/2014 | Mittal et al. | |
| 2015/0089280 A1 | 3/2015 | Sade et al. | |
| 2016/0132259 A1 | 5/2016 | Dell et al. | |
| 2016/0239228 A1 | 8/2016 | Bennett | |
| 2018/0067719 A1 | 3/2018 | Dodson et al. | |
| 2018/0067806 A1 | 3/2018 | Dodson et al. | |
| 2018/0068741 A1 | 3/2018 | Dodson et al. | |

\* cited by examiner

PERFORMING ERROR CORRECTION IN COMPUTER MEMORY

BACKGROUND

Field of the Invention

The field of the invention is data processing, or, more specifically, methods, apparatus, and products for performing error correction in computer memory.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

SUMMARY

Methods, systems, and apparatus for performing error correction in computer memory are disclosed in this specification. Performing error correction in computer memory includes receiving a read request targeting a read address within the computer memory; accessing a mark table comprising a plurality of entries, each entry including a field specifying a region size, a field specifying a match address, and a field specifying a mark location; performing a lookup of the mark table using the read address including, for each entry in the mark table: generating a mask based on the region size stored in the entry; determining, based on the mask, whether the read address is within a memory region specified by the match address and region size stored in the entry; and if the read address is within the memory region specified by the match address and region size stored in the entry, performing error correction using the mark location stored in the entry.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
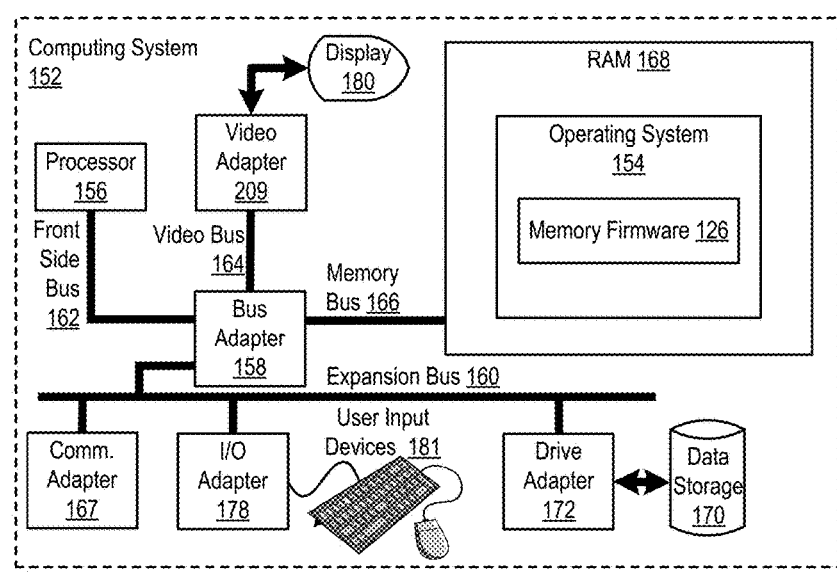
FIG. 1 sets forth a block diagram of an example system configured for performing error correction in computer memory according to embodiments of the present invention.

Exemplary methods, apparatus, and products for performing error correction in computer memory in accordance with the present invention are described with reference to the accompanying drawings, beginning with FIG. 1. FIG. 1 sets forth a block diagram of automated computing machinery comprising an exemplary computing system (152) configured for performing error correction in computer memory according to embodiments of the present invention. The computing system (152) of FIG. 1 includes at least one computer processor (156) or 'CPU' as well as random access memory (168) ('RAM') which is connected through a high speed memory bus (166) and bus adapter (158) to processor (156) and to other components of the computing system (152).

Stored in RAM (168) is an operating system (154). Operating systems useful in computers configured for performing error correction in computer memory according to embodiments of the present invention include UNIX™, Linux™, Microsoft XP™, AIX™, IBM's i5/OS™, and others as will occur to those of skill in the art. The operating system (154) in the example of FIG. 1 is shown in RAM (168), but many components of such software typically are stored in non-volatile memory also, such as, for example, on a disk drive (170). Also stored in RAM (168) and part of the operating system is the memory firmware (126), a module of computer program instructions for performing error correction in computer memory.

The computing system (152) of FIG. 1 includes disk drive adapter (172) coupled through expansion bus (160) and bus adapter (158) to processor (156) and other components of the computing system (152). Disk drive adapter (172) connects non-volatile data storage to the computing system (152) in the form of disk drive (170). Disk drive adapters useful in computers configured for performing error correction in computer memory according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing system (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computing system (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computing system (152) of FIG. 1 includes a communications adapter (167) for data communications with other computers (182) and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for performing error correction in computer memory according to embodiments of the present invention include modems for wired dial-up communications, Ethernet (IEEE 802.3) adapters for wired data communications, and 802.11 adapters for wireless data communications.

Figure 2:
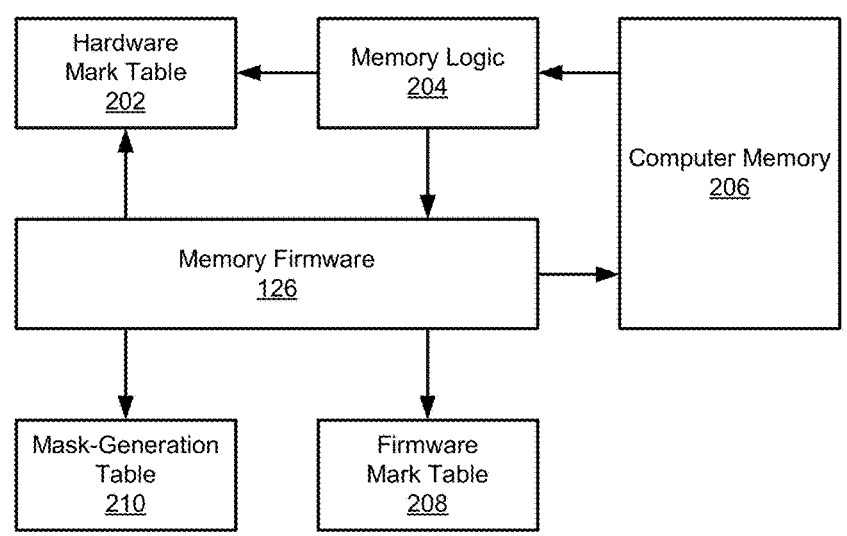
FIG. 2 sets forth a block diagram for performing error correction in computer memory according to embodiments of the present invention.

FIG. 2 is an example block diagram of a system configured for performing error correction in computer memory. FIG. 2 includes a hardware mark table (202), memory logic (204), computer memory (206) (such as RAM (168)), memory firmware (126), and a firmware mark table (208).

The error correction code (ECC) system uses two types of marks that correspond to different sets of bit error locations. Symbol marks indicate errors expected in one or more bits associated with a particular DRAM data bit. Such errors may be caused, for example, by a faulty DRAM data I/O pin or by a DRAM internal failure which affects only bits within the set. Chip marks indicate errors expected in one or more bits associated with a particular DRAM chip. Such errors may be caused, for example, by multiple faulty DRAM data I/O pins, a faulty dram address or control I/O pin, or a DRAM internal failure which affects a larger portion of data than would be covered by a symbol mark. A chip mark is equivalent to a set of symbol marks covering all data from one DRAM chip.

The hardware mark table (202) is a data structure architected in hardware with fields that may be altered. The hardware mark table (202) may be a part of the computer memory (206) hardware, the CPU hardware, or another hardware structure within the computing system. The hardware mark table (202) is configured to store information about detected errors within the computer memory (206). Specifically, the hardware mark table (202) may store a chip mark for a single region (e.g., a rank) within the computer memory (206).

The hardware mark table (202) may be limited to storing a single type of error (e.g., a chip mark). Further, the hardware mark table (202) may also be limited to indicating an error in a single region level. For example, the hardware mark table (202) may store a chip mark for one or more ranks in the computer memory (206). The hardware mark table (202) may be unable to store a second error indication (e.g., a symbol mark) or indicate that the error applies to a broader or narrower set of elements within the computer memory (206) (e.g., a dual in-line memory module (DIMM), a group of banks, or a bank).

The memory logic (204) is a collection of programs within hardware, software, or firmware that detects errors within the computer memory (206) and reports those errors using the hardware mark table (202). The memory logic (204) may be limited in the types and applicability of the errors the memory logic (204) is able to report. For example, the memory logic (204) may only be able to detect one type of error in one region (e.g., at least one unreliable 4 bit word within a rank).

The computer memory (206) is a group of bit storage devices used to store data for a computing system. The computer memory (206) may include a hierarchy of components. For example, each bit storage device may be a capacitor, and the capacitors may be grouped in banks. The banks may be grouped in bank groups, a set of bank groups may be organized into a rank, and a set of ranks may be organized into a DIMM.

The memory firmware (126) is a collection of programs within the computing system used to facilitate interoperability between the software components on the computing system and the memory hardware. The memory firmware (126) may be part of an operating system or hypervisor executing on the computing system. The memory firmware (126) may further include functionality to initiate a scan of the computer memory using, for example, a scrub engine that scans a region of the computer memory (206) to obtain information about the error, such as the type of error and the range of memory addresses affected by the error. The memory firmware (126) may then store the information in the firmware mark table (208).

The firmware mark table (208) is a mark table used by the memory firmware (126) to store information about detected errors in the computer memory (206). The firmware mark table (208) may store more information about detected errors then may be stored in the hardware mark table (202). Each entry in the firmware mark table (208) may include a match address, a region size, and a mark location for each error detected by the memory firmware (126). Although FIG. 2 shows the hardware mark table (202) and the firmware mark table (208) as separately implemented tables, the hardware mark table (202) and the firmware mark table (208) may be implemented as a single table (e.g., a single firmware mark table).

The firmware mark table (208) may be stored in content-addressable memory (CAM) such that the contents may be retrieved using a CAM lookup. The firmware mark table (208) may be configured such that entries may be retrieved by matching a memory address to a match address of an entry in the firmware mark table (208). A matching entry may also incorporate the region size to determine a match. Specifically, a match may be a hit if the given memory address is within the same specified region as the match address.

The mask-generation table (210) is a data structure that stores data for use by the memory firmware (126) in order to generate a mask. A mask is a set of elements (e.g., bits) that is used to determine whether a read address is within the region of a detected error stored in the firmware mark table (208). The mask-generation table (210) may include a mask for a corresponding region size. The mask-generation table may be stored in hardware or in computer memory (e.g., in RAM). Table 1 shows an exemplary mask-generation table.

TABLE 1

| Region Size | DIMM | Master Rank | | Slave Rank | | | Bank Group | | Bank | | |
|---|---|---|---|---|---|---|---|---|---|---|---|
| 000 | 0 | 0 | 0 | 0 | 0 | 0 | 0 | 0 | 0 | 0 | 0 |
| 001 | 0 | 0 | 0 | 0 | 0 | 0 | 0 | 0 | 0 | 0 | 0 |
| 010 | 0 | 0 | 0 | 0 | 0 | 0 | 0 | 0 | 0 | 0 | 0 |
| 011 | 0 | 0 | 0 | 0 | 0 | 0 | 0 | 0 | 1 | 1 | 1 |
| 100 | 0 | 0 | 0 | 0 | 0 | 0 | 1 | 1 | 1 | 1 | 1 |
| 101 | 0 | 0 | 0 | 1 | 1 | 1 | 1 | 1 | 1 | 1 | 1 |
| 110 | 0 | 1 | 1 | 1 | 1 | 1 | 1 | 1 | 1 | 1 | 1 |
| 111 | 1 | 1 | 1 | 1 | 1 | 1 | 1 | 1 | 1 | 1 | 1 |

Each entry in the mask-generation table (210) may be keyed to a region size code and include a mask for a given region size code. As shown in Table 1, there are eight entries keyed to region size codes 000, 001, 010, 011, 100, 101, 110, and 111. Each region size code in Table 1 has a corresponding mask, with each element in the mask associated with a region of the computer memory.

Certain elements (such as the '1' elements in Table 1) may indicate the portions of the address that are ignored or read out, while other elements (such as the '0' elements in Table 1) may indicate portions of the address that must be the same for a match to exist. For example, as shown in Table 1, region size code '111' corresponds to a mask of '11111111111', which indicates that none of the masked elements of the read address must be matched to the match address for a match to exist. Also within Table 1, region size code '000' corresponds to a mask of '00000000000', which indicates that all of the masked elements of the read address must be matched to the match address for a match to exist.

The mask may be computed without the use of the mask-generation table (210). An algorithm may be used to derive the mask from the region size code. For example, an algorithm may be used to derive the mask '00000011111' from the region size code of '100'.

Figure 3:
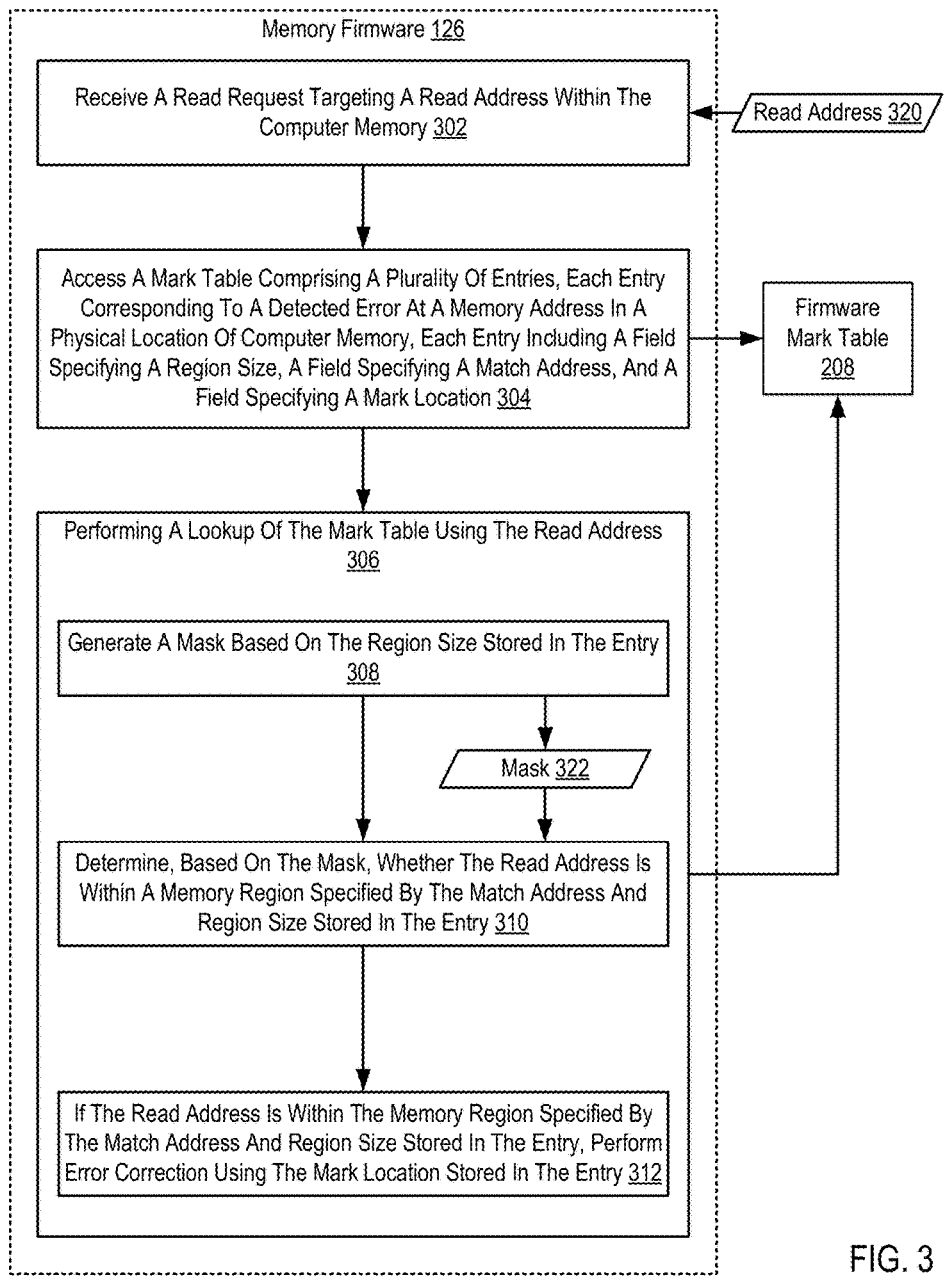
FIG. 3 sets forth a flow chart illustrating an exemplary method for performing error correction in computer memory according to embodiments of the present invention.

For further explanation, FIG. 3 sets forth a flow chart illustrating an exemplary method for performing error correction in computer memory according to embodiments of the present invention. The method of FIG. 3 includes receiving (302) a read request targeting a read address (320) within the computer memory. Receiving (302) a read request targeting a read address (320) within the computer memory may be carried out by the operating system, application, or other element attempting to read data from the computer memory. The read request may be received by the memory firmware (126), and the read address may be an address within the computer memory.

The method of FIG. 3 also includes accessing (304) a mark table (208) comprising a plurality of entries, each entry corresponding to a detected error at a memory address in a physical location of computer memory, each entry including a field specifying a region size, a field specifying a match address, and a field specifying a mark location. Accessing (304) a mark table (208) comprising a plurality of entries, each entry corresponding to a detected error at a memory address in a physical location of computer memory, each entry including a field specifying a region size, a field specifying a match address, and a field specifying a mark location may be carried out by the memory firmware (126) determining a location for the mark table (208) and sending a query to that location.

The mark table (208) may include entries for errors detected in the computer memory. Each mark table entry may further include information indicating the region effected by the detected errors. The match address of each entry in the mark table (208) may be set as the memory address of the detected error. Alternatively, the match address may be calculated based on the element or elements affected by the detected error.

The field specifying the region size may include a code identifying the region level required for a match to the match address. For example, '111' may indicate that a match is a hit if the search address is within the same whole memory port as the match address, '110' may indicate that a match is a hit if the search address is within the same DIMM as the match address, '101' may indicate that a match is a hit if the search address is within the same DIMM and same master rank as the match address, '100' may indicate that a match is a hit if the search address is within the same DIMM, same master rank, and same slave rank as the match address, '011' may indicate that a match is a hit if the search address is within the same DIMM, same master rank, same slave rank, and same bank group as the match address, and '010' may indicate that a match is a hit if the search address is within the same DIMM, same master rank, same slave rank, same bank group, and same bank as the match address.

The method of FIG. 3 also includes performing (306) a lookup of the mark table (208) using the read address (320). Performing (306) a lookup of the mark table (208) using the read address (320) may be carried out by generating (308) a mask (322) based on the region size stored in the entry; determining (310), based on the mask (322), whether the read address (320) is within a memory region specified by the match address and region size stored in the entry; and, if the read address (320) is within the memory region specified by the match address and region size stored in the entry, performing (312) error correction using the mark location stored in the entry. The lookup may be performed by the memory firmware (126) and may be conducted using a CAM lookup.

Generating (308) a mask (322) based on the region size stored in the entry may be carried out by retrieving, from the mark table entry, a region size for the entry, and generate a mask (322) based on the region size. The mask (322) may be calculated using an algorithm with the region size as an input. The mask (322) may be generated by accessing an entry in a mask-generation table corresponding to the region size stored in the entry; and retrieving the mask from the entry in the mask-generation table. Accessing an entry in a mask-generation table corresponding to the region size stored in the entry may be carried out by performing a table lookup on the mask-generation table.

Determining (310), based on the mask (322), whether the read address (320) is within a memory region specified by the match address and region size stored in the entry may be carried out by masking one or more of the addresses, and determining whether the read address is included within the region specified by the match address and the region size. Specifically, determining (310), based on the mask (322), whether the read address (320) is within a memory region specified by the match address and region size stored in the entry may be carried out by applying the mask to the read address and the match address to obtain a masked read address and a masked match address; and determining whether the masked read address and the masked match address are equal.

Determining (310), based on the mask (322), whether the read address (320) is within a memory region specified by the match address and region size stored in the entry may also be carried out by applying an XOR operation to the read address and the match address to obtain a result address; applying the mask to the result address to obtain a masked result address; and determining whether the masked result address is equal to zero. The memory region may be a dual in-line memory module (DIMM), a rank, a bank group, a bank, or any other subset of computer memory.

The mask may be applied to all or part of an address (e.g., read address, match address, result address). For example, the size of the mask may be smaller than the size of the address, and the mask may be applied only to the first part, a middle part, or a last part of the address.

Performing (312) error correction using the mark location stored in the entry may be carried out by utilizing the error correcting code (ECC) stored in the computer memory to calculate the data stored in the unreliable or error-prone address. The mark location may indicate a type of error detected and a method of addressing the error. The information stored in the mark location may be utilized by the memory firmware (126) or other elements on the computing system to perform the error correction (e.g., an erasure).

If the read address (320) is not within the memory region specified by the match address and region size stored in the entry, the memory firmware (126) will attempt to match the read address to the next entry. If the read address does not match any entry in the mark table (208), then the hardware mark table may be searched to determine whether a detected error for the read address has been stored in the hardware mark table. If no entries matching the read address are found in either the firmware mark table (208) or the hardware mark table, then the read proceeds normally or through error correction without use of marks.

Figure 4:
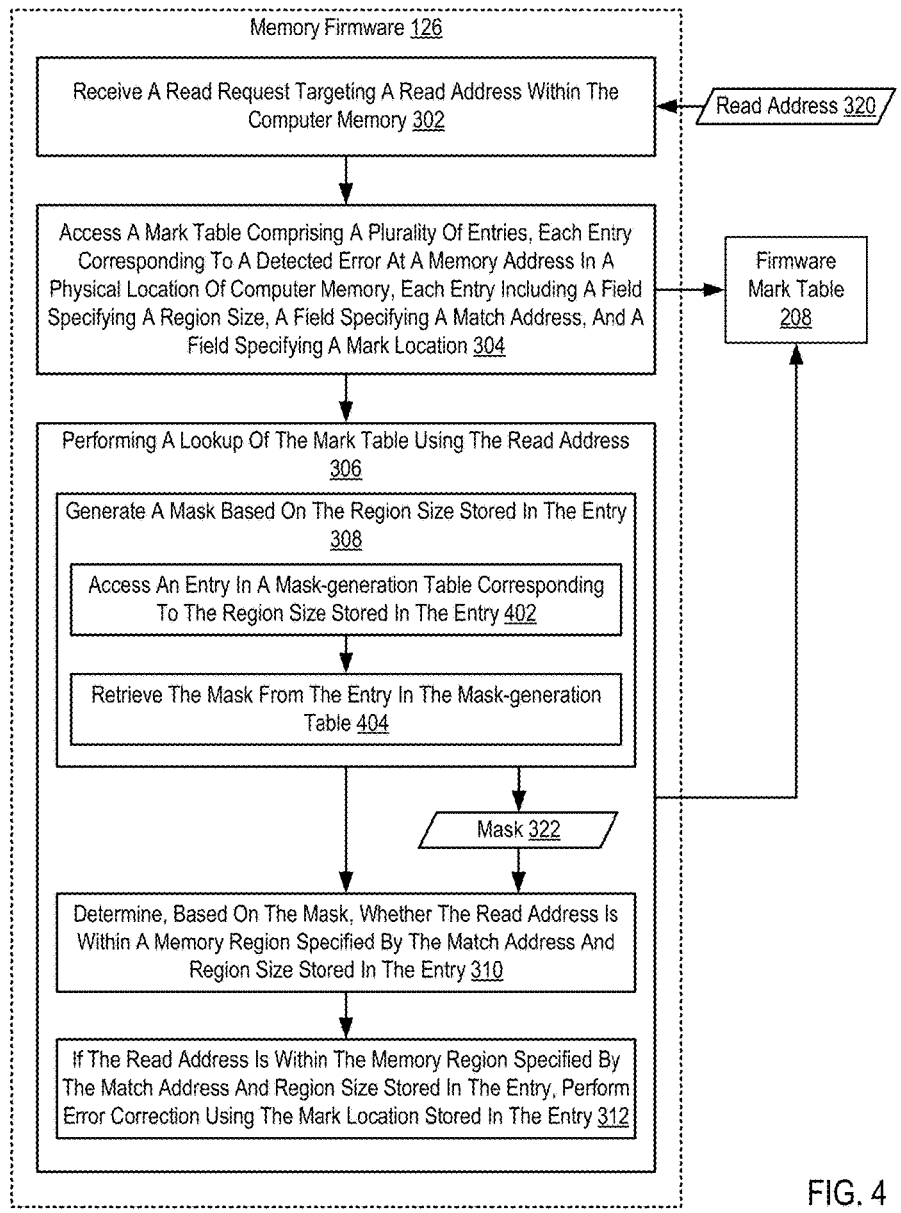
FIG. 4 sets forth a flow chart illustrating an exemplary method for performing error correction in computer memory according to embodiments of the present invention.

For further explanation, FIG. 4 sets forth a flow chart illustrating an exemplary method for performing error correction in computer memory according to embodiments of the present invention that includes receiving (302) a read request targeting a read address (320) within the computer memory; accessing (304) a mark table (208) comprising a plurality of entries, each entry corresponding to a detected error at a memory address in a physical location of computer memory, each entry including a field specifying a region size, a field specifying a match address, and a field specifying a mark location; performing (306) a lookup of the mark table (208) using the read address (320) including, for each entry in the mark table: generating (308) a mask (322) based on the region size stored in the entry; determining (310), based on the mask (322), whether the read address (320) is within a memory region specified by the match address and region size stored in the entry; and if the read address (320) is within the memory region specified by the match address and region size stored in the entry, performing (312) error correction using the mark location stored in the entry.

The method of FIG. 4 differs from the method of FIG. 3, however, in that generating (308) a mask (322) based on the region size stored in the entry includes accessing (402) an entry in a mask-generation table corresponding to the region size stored in the entry; and retrieving (404) the mask from the entry in the mask-generation table. Accessing (402) an entry in a mask-generation table corresponding to the region size stored in the entry may be carried out by the memory firmware (126) determining a location for the mask-generation table and sending a query to that location. The query may include the region size stored in the mark table entry, and the region size may be a code keyed to an entry in the mask-generation table. The memory firmware (126) may retrieve a region size from the mark table entry, and search the mask-generation table for an entry keyed to the region size.

Retrieving (404) the mask from the entry in the mask-generation table may be carried out by determining that an entry for the region size exists, and reading the mask stored in the matching mask-generation table entry. For example, the memory firmware (126) may access an entry in the mark table (208) with a region size of '101'. The memory firmware (126) may then search the mask-generation table for an entry matching the region size of '101'. Using the example, mask-generation table of Table 1, the memory firmware (126) would retrieve the mask '00011111111' from the entry matching the region size of '101'. This mask indicates that only the DIMM and master rank portion of the read address and match address must be the same for a match to exist.

Figure 5:
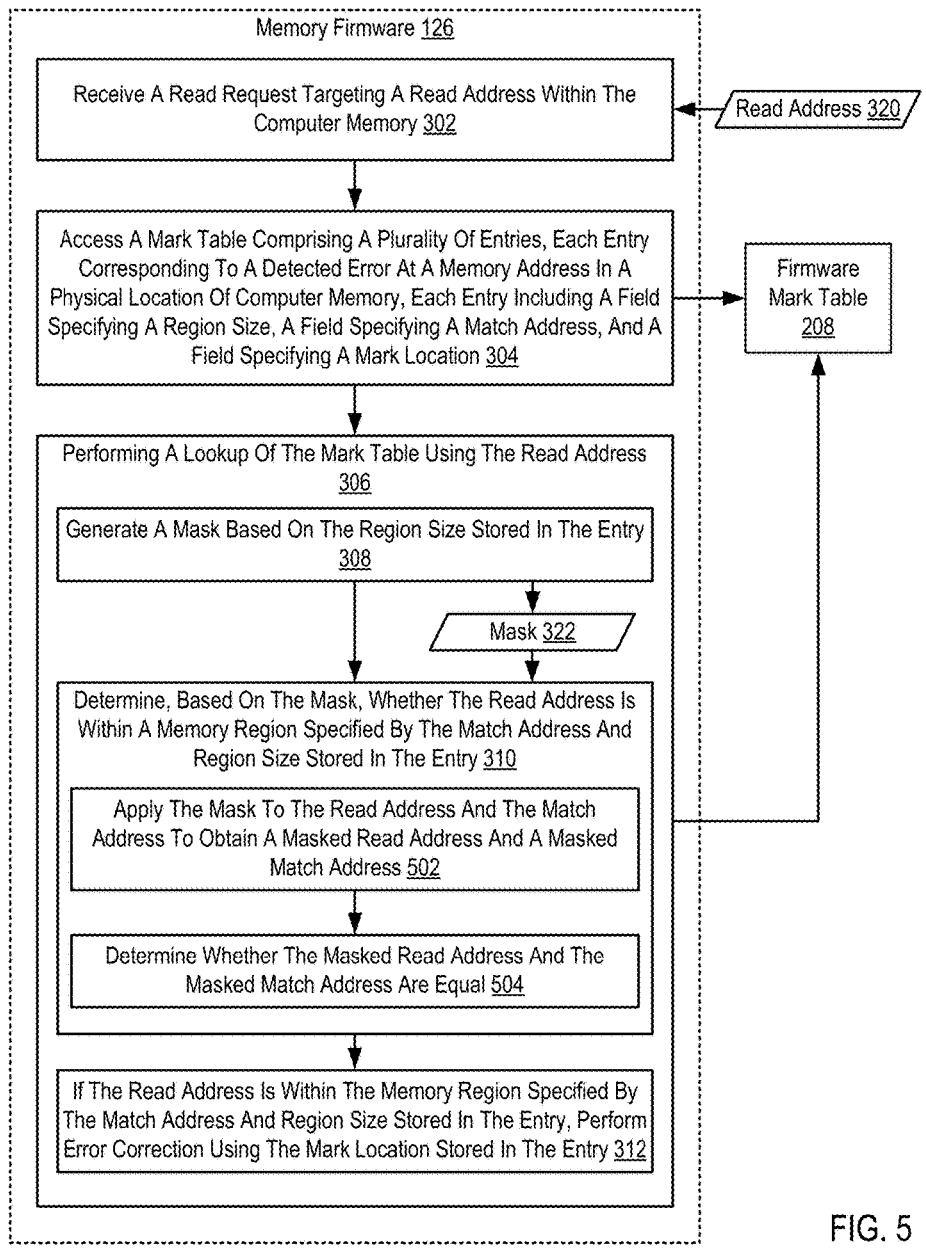
FIG. 5 sets forth a flow chart illustrating an exemplary method for performing error correction in computer memory according to embodiments of the present invention.

For further explanation, FIG. 5 sets forth a flow chart illustrating an exemplary method for performing error correction in computer memory according to embodiments of the present invention that includes receiving (302) a read request targeting a read address (320) within the computer memory; accessing (304) a mark table (208) comprising a plurality of entries, each entry corresponding to a detected error at a memory address in a physical location of computer memory, each entry including a field specifying a region size, a field specifying a match address, and a field specifying a mark location; performing (306) a lookup of the mark table (208) using the read address (320) including, for each entry in the mark table: generating (308) a mask (322) based on the region size stored in the entry; determining (310), based on the mask (322), whether the read address (320) is within a memory region specified by the match address and region size stored in the entry; and if the read address (320) is within the memory region specified by the match address and region size stored in the entry, performing (312) error correction using the mark location stored in the entry.

The method of FIG. 5 differs from the method of FIG. 3, however, in that determining (310), based on the mask (322), whether the read address (320) is within a memory region specified by the match address and region size stored in the entry includes applying (502) the mask to the read address and the match address to obtain a masked read address and a masked match address; and determining (504) whether the masked read address and the masked match address are equal. Applying (502) the mask to the read address and the match address to obtain a masked read address and a masked match address may be carried out by erasing, reading out, or replacing a portion of each address corresponding to the masked-off portion of the mask (322).

For example, assume a read address of '10110111010' and a match address of '10110101100' with a region size of '100'. Using the example mask-generation table of Table 1, the mask (322) for the region size '100' is '00000011111' indicating the last five elements of the address are to be read out. Accordingly, applying the mask to the read address would result in '10110100000', and applying the mask to the match address would result in '10110100000'.

Determining (504) whether the masked read address and the masked match address are equal may be carried out by comparing the masked read address and the masked match address. Continuing with the example above, the masked read address '10110100000' is compared to the masked match address of '10110100000'. The masked read address and the masked match address express the same set of elements, and are therefore equal.

Figure 6:
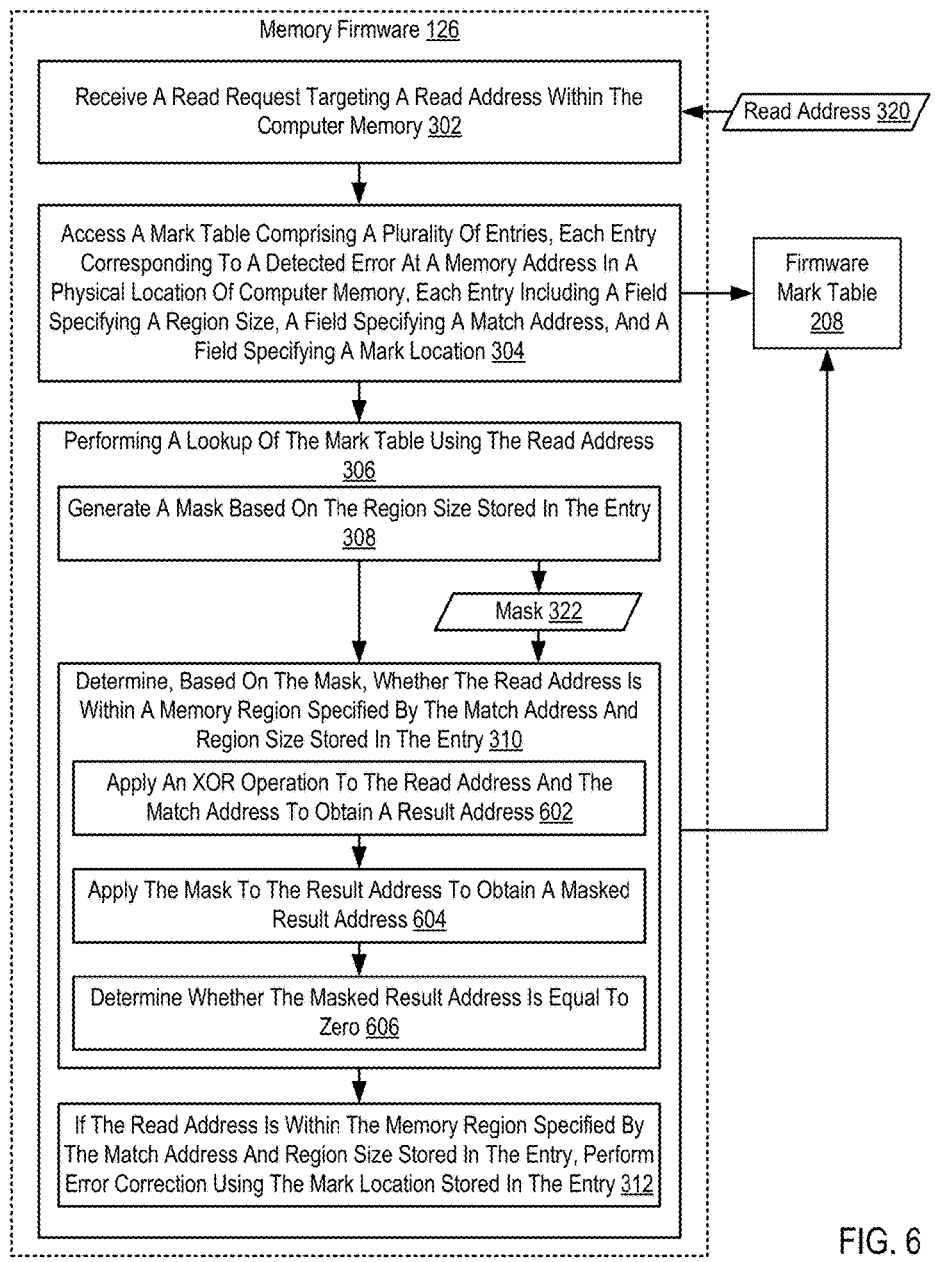
FIG. 6 sets forth a flow chart illustrating an exemplary method for performing error correction in computer memory according to embodiments of the present invention.

For further explanation, FIG. 6 sets forth a flow chart illustrating an exemplary method for performing error correction in computer memory according to embodiments of the present invention that includes receiving (302) a read request targeting a read address (320) within the computer memory; accessing (304) a mark table (208) comprising a plurality of entries, each entry corresponding to a detected error at a memory address in a physical location of computer memory, each entry including a field specifying a region size, a field specifying a match address, and a field specifying a mark location; performing (306) a lookup of the mark table (208) using the read address (320) including, for each entry in the mark table: generating (308) a mask (322) based on the region size stored in the entry; determining (310), based on the mask (322), whether the read address (320) is within a memory region specified by the match address and region size stored in the entry; and if the read address (320) is within the memory region specified by the match address and region size stored in the entry, performing (312) error correction using the mark location stored in the entry.

The method of FIG. 6 differs from the method of FIG. 3, however, in that determining (310), based on the mask (322), whether the read address (320) is within a memory region specified by the match address and region size stored in the entry includes applying (602) an XOR operation to the read address and the match address to obtain a result address; applying (604) the mask to the result address to obtain a masked result address; and determining (606) whether the masked result address is equal to zero. Applying (602) an XOR operation to the read address and the match address to obtain a result address may be carried out by calculating a logical exclusive-or (XOR) operation on each equivalent element of the read address and the match address. For example, assume a read address of '10110111010' and a match address of '10110101100'. Performing the logical XOR operation on the two sets of elements results in the set '00000010110'.

Applying (604) the mask to the result address to obtain a masked result address may be carried out by erasing, reading out, or replacing a portion of the result address corresponding to the masked-off portion of the mask (322). Continuing with the example above, assume the region size of the mark table entry is '100', and the mask (322) obtained from the mask-generation table is '00000011111'. Applying the mask (322) of '00000011111' to the result address of '00000010110' results in the set of elements '00000000000'.

Determining (606) whether the masked result address is equal to zero may be carried out by evaluating the masked result address and determining whether each element in the result address is '0' or 'down'. Continuing with the above example, the masked result address is '00000000000', and would be determined to be zero by the memory firmware (126).

In view of the explanations set forth above, readers will recognize that the benefits of performing error correction in computer memory according to embodiments of the present invention include:

Improving the operation of a computer system by tracking additional information about memory errors to increase memory reliability and predictability.

Improving the operation of a computer system by efficiently determining errors within computer memory during memory reads to increase memory reliability and predictability.

Improving the operation of a computer system by tracking multiple errors within the same region of computer memory to increase memory reliability and predictability.

Exemplary embodiments of the present invention are described largely in the context of a fully functional computer system for performing error correction in computer memory. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of performing error correction in computer memory, the method comprising:
   receiving a read request targeting a read address within the computer memory;
   accessing a mark table comprising a plurality of entries, each entry corresponding to a detected error at a memory address in a physical location of computer memory, each entry including a field specifying a region size, a field specifying a match address, and a field specifying a mark location;
   performing a lookup of the mark table using the read address including, for each entry in the mark table:
      generating a mask based on the region size stored in the entry;
      determining, based on the mask, whether the read address is within a memory region specified by the match address and region size stored in the entry, wherein determining, based on the mask, whether the read address is within the memory region specified by the match address and region size stored in the entry comprises:
         applying the mask to the read address and the match address to obtain a masked read address and a masked match address; and
         determining whether the masked read address and the masked match address are equal; and
      if the read address is within the memory region specified by the match address and region size stored in the entry, performing error correction using the mark location stored in the entry.

2. The method of claim 1, wherein the mark table is stored in content addressable memory (CAM), and wherein the lookup is a CAM lookup.

3. The method of claim 1, wherein generating the mask based on the region size stored in the entry comprises:
accessing an entry in a mask-generation table corresponding to the region size stored in the entry; and
retrieving the mask from the entry in the mask-generation table.

4. The method of claim 1, wherein the memory region is one selected from a group consisting of a dual in-line memory module (DIMM), a rank, a bank group, and a bank.

5. The method of claim 1, wherein the field specifying the mark location indicates at least one of a group consisting of a chip mark and a symbol mark.

6. An apparatus for performing error correction in computer memory, the apparatus comprising memory firmware and a mark table, the apparatus configured to carry out the steps of:
receiving, by the memory firmware, a read request targeting a read address within the computer memory;
accessing, by the memory firmware, the mark table comprising a plurality of entries, each entry corresponding to a detected error at a memory address in a physical location of computer memory, each entry including a field specifying a region size, a field specifying a match address, and a field specifying a mark location;
performing, by the memory firmware, a lookup of the mark table using the read address including, for each entry in the mark table:
generating a mask based on the region size stored in the entry;
determining, based on the mask, whether the read address is within a memory region specified by the match address and region size stored in the entry, wherein determining, based on the mask, whether the read address is within the memory region specified by the match address and region size stored in the entry comprises:
applying the mask to the read address and the match address to obtain a masked read address and a masked match address; and
determining whether the masked read address and the masked match address are equal; and
if the read address is within the memory region specified by the match address and region size stored in the entry, performing error correction using the mark location stored in the entry.

7. The apparatus of claim 6, wherein the mark table is stored in content addressable memory (CAM), and wherein the lookup is a CAM lookup.

8. The apparatus of claim 6, wherein generating the mask based on the region size stored in the entry comprises:
accessing an entry in a mask-generation table corresponding to the region size stored in the entry; and
retrieving the mask from the entry in the mask-generation table.

9. The apparatus of claim 6, wherein the memory region is one selected from a group consisting of a dual in-line memory module (DIMM), a rank, a bank group, and a bank.

10. The apparatus of claim 6, wherein the field specifying the mark location indicates at least one of a group consisting of a chip mark and a symbol mark.

11. A non-transitory computer readable medium comprising computer program instructions that, when executed by a computer processor, carry out the steps of:
receiving a read request targeting a read address within the computer memory;
accessing a mark table comprising a plurality of entries, each entry corresponding to a detected error at a memory address in a physical location of computer memory, each entry including a field specifying a region size, a field specifying a match address, and a field specifying a mark location;
performing a lookup of the mark table using the read address including, for each entry in the mark table:
generating a mask based on the region size stored in the entry;
determining, based on the mask, whether the read address is within a memory region specified by the match address and region size stored in the entry, wherein determining, based on the mask, whether the read address is within the memory region specified by the match address and region size stored in the entry comprises:
applying the mask to the read address and the match address to obtain a masked read address and a masked match address; and
determining whether the masked read address and the masked match address are equal; and
if the read address is within the memory region specified by the match address and region size stored in the entry, performing error correction using the mark location stored in the entry.

12. The computer program product of claim 11, wherein the mark table is stored in content addressable memory (CAM), and wherein the lookup is a CAM lookup.

13. The computer program product of claim 11, wherein generating the mask based on the region size stored in the entry comprises:
accessing an entry in a mask-generation table corresponding to the region size stored in the entry; and
retrieving the mask from the entry in the mask-generation table.

14. The computer program product of claim 11, wherein the memory region is one selected from a group consisting of a dual in-line memory module (DIMM), a rank, a bank group, and a bank.

* * * * *